United States Patent
Choi et al.

(10) Patent No.: US 9,971,380 B2
(45) Date of Patent: May 15, 2018

(54) FLEXIBLE DISPLAY APPARATUS

(71) Applicant: SAMSUNG DISPLAY CO., LTD., Yongin-si, Gyeonggi-do (KR)

(72) Inventors: Beomgyu Choi, Yongin-si (KR); Jongsoo Lee, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days. days.

(21) Appl. No.: 15/403,726

(22) Filed: Jan. 11, 2017

(65) Prior Publication Data

US 2017/0199544 A1    Jul. 13, 2017

(30) Foreign Application Priority Data

Jan. 11, 2016 (KR) .................. 10-2016-0003345

(51) Int. Cl.

| | | |
|---|---|---|
| *G06F 1/16* | (2006.01) | |
| *H01L 51/00* | (2006.01) | |
| *H01L 51/52* | (2006.01) | |
| *H01L 27/32* | (2006.01) | |
| *G02F 1/1333* | (2006.01) | |
| *H05K 1/02* | (2006.01) | |

(52) U.S. Cl.
CPC ........ *G06F 1/1626* (2013.01); *H01L 51/0097* (2013.01); *H01L 51/5237* (2013.01); *G02F 1/133305* (2013.01); *H01L 27/3244* (2013.01); *H01L 2251/5338* (2013.01); *H05K 1/028* (2013.01); *Y02E 10/549* (2013.01)

(58) Field of Classification Search
CPC ............... G06F 1/1626; H01L 51/0097; H01L 51/5237; H01L 27/3244; H01L 2251/5338; Y02E 10/549; G02F 1/133305; G02F 1/13452; H05K 1/028; H05K 2201/10128

See application file for complete search history.

(56) References Cited

U.S. PATENT DOCUMENTS

| | | | |
|---|---|---|---|
| 9,048,444 | B2 | 6/2015 | Kim et al. |
| 2009/0213292 | A1* | 8/2009 | Park ................... G02F 1/13452 349/58 |
| 2011/0007042 | A1* | 1/2011 | Miyaguchi ........ G02F 1/133305 345/204 |

(Continued)

FOREIGN PATENT DOCUMENTS

| | | |
|---|---|---|
| KR | 10-2014-0080272 | 6/2014 |
| KR | 10-2014-0101295 | 8/2014 |

(Continued)

*Primary Examiner* — Dimary Lopez Cruz
*Assistant Examiner* — Abhishek Rathod
(74) *Attorney, Agent, or Firm* — F. Chau & Associates, LLC.

(57) ABSTRACT

A flexible display apparatus includes a display panel that is bendable or foldable about at least one bending axis, a support unit having a first surface positioned adjacent to the display panel, a second surface positioned opposite to the first surface, and a plurality of uneven portions disposed on the second surface, a window unit disposed opposite to the support unit so that the display panel is disposed between the window unit and the support unit, and a fixing unit disposed adjacent an edge of the support unit and on a surface of the support unit that extends from the second surface, wherein a shape of the fixing unit is complementary to a shape of an uneven portion.

19 Claims, 7 Drawing Sheets

(56) References Cited

U.S. PATENT DOCUMENTS

| | | | |
|---|---|---|---|
| 2011/0050657 A1* | 3/2011 | Yamada | H01L 27/3293 345/204 |
| 2014/0307396 A1* | 10/2014 | Lee | H05K 1/028 361/749 |
| 2015/0021570 A1* | 1/2015 | Kim | H01L 51/0097 257/40 |
| 2016/0210894 A1 | 7/2016 | Lee | |

FOREIGN PATENT DOCUMENTS

| | | |
|---|---|---|
| KR | 10-2014-0108826 | 9/2014 |
| KR | 10-2014-0122597 | 10/2014 |
| KR | 10-2015-0010411 | 1/2015 |

\* cited by examiner

FLEXIBLE DISPLAY APPARATUS

CROSS-REFERENCE TO RELATED APPLICATION

This application claims priority under 35 U.S.C. § 119 from, and the benefit of, Korean Patent Application No. 10-2016-0003345, filed on Jan. 11, 2016 in the Korean Intellectual Property Office, the contents of which are herein incorporated by reference in their entirety.

BACKGROUND

1. Technical Field

One or more embodiments are directed to a flexible display apparatus, and more particularly, to a flexible display apparatus that is foldable or bendable at various portions thereof.

2. Discussion of the Related Art

A display apparatus can be used for various purposes. In particular, since display apparatuses have become thin and light-weight, the scope of usage of display apparatuses has widened. Among display apparatuses, a portable thin-flat type flexible display apparatus has received attention from users. Such a flexible display apparatus is portable, light-weight and shock-resistant, since a flexible display apparatus can be stored folded and rolled.

In addition, as personal electronic apparatuses, such as smart phones or tablet PCs, become more widely used, demands on portability and user convenience have also increased.

However, a display apparatus is limited in that a user cannot bend or fold the display apparatus at a desired position.

SUMMARY

One or more embodiments can provide a flexible display apparatus that is bendable or foldable at various portions thereof.

According to one or more embodiments, a flexible display apparatus includes a display panel that is bendable or foldable about at least one bending axis, a support unit that includes a first surface positioned adjacent to the display panel, a second surface positioned opposite to the first surface, and a plurality of uneven portions disposed on the second surface, a window unit disposed opposite to the support unit so that the display panel is disposed between the window unit and the support unit, and a fixing unit disposed adjacent an edge of the support unit and on a surface of the support unit that extends from the second surface, where a shape of the fixing unit is complementary to a shape of an uneven portion.

According to one or more embodiments, the plurality of uneven portions may be separated from each other and disposed along a direction substantially perpendicular to that of the at least one bending axis.

According to one or more embodiments, each of the respective uneven portions may have a same shape.

According to one or more embodiments, when the display panel is bent or folded, the support unit and the window unit may be bent or folded to correspond to the display panel.

According to one or more embodiments, when the display panel is bent or folded, the fixing unit attaches to one of the plurality of uneven portions.

According to one or more embodiments, a distance between the at least one bending axis and the fixing unit is the same as a distance between the bending axis and one of the plurality of uneven portions.

According to one or more embodiments, the flexible display apparatus may further include a plurality of bending axes, where the respective bending axes may be parallel to each other.

According to one or more embodiments, at least a portion of the display panel may be is convex toward the window unit, when bent or folded.

According to one or more embodiments, the display panel may display an image viewable through the window unit.

According to one or more embodiments, the support unit may include a bent portion which extends toward the window unit, and at least a portion of the fixing unit may overlap the first bent portion.

According to one or more embodiments, the window unit may include a bent portion which extends toward the support unit, and at least a portion of the fixing unit may overlap the bent portion.

According to one or more embodiments, a flexible display apparatus includes a bendable support unit; a bendable window unit disposed opposite to the support unit, wherein the support unit includes a first surface positioned facing the window unit, a second surface positioned opposite to the first surface, and a plurality of uneven portions disposed on the second surface, wherein each of the plurality of uneven portions has a same shape; and a fixing unit disposed adjacent to an edge of the support unit and on a surface of the support unit that extends from the second surface, wherein a shape of the fixing unit is complementary to a shape of an uneven portion, and wherein when the display apparatus is bent or folded, the fixing unit attaches to one of the plurality of uneven portions.

According to one or more embodiments, the flexible display apparatus may further include a display panel disposed between the window unit and the support unit that is bendable or foldable about at least one bending axis.

According to one or more embodiments, the plurality of uneven portions may be separated from each other and disposed along a direction substantially perpendicular to that of the at least one bending axis, and extend in a direction parallel to the at least one bending axis.

According to one or more embodiments, the flexible display apparatus may further include a plurality of parallel bending axes, wherein each of the plurality of bending axes is halfway between the fixing unit and one of the plurality of uneven portions.

According to one or more embodiments, each of the plurality of uneven portions may be a groove with a concave shape which is recessed inward from the second surface toward the first surface, and the fixing unit may be a ridge with a convex shape that protrudes outward from second surface, wherein, when the display apparatus is bent or folded, the fixing unit inserts into one of the plurality of uneven portions.

According to one or more embodiments, each of the plurality of uneven portions may be a ridge with a convex shape which protrudes outward from the second surface, and the fixing unit may be a groove with a concave shape that is recessed inward from second surface toward the first surface, wherein, when the display apparatus is bent or folded, the fixing unit receives one of the plurality of uneven portions.

According to one or more embodiments, the support unit may include includes a bent portion which extends toward the window unit; and at least a portion of the fixing unit may overlap the bent portion.

According to one or more embodiments, the window unit may include a bent portion which extends toward the support unit; and at least a portion of the fixing unit may overlaps the bent portion.

DETAILED DESCRIPTION

Figure 1:
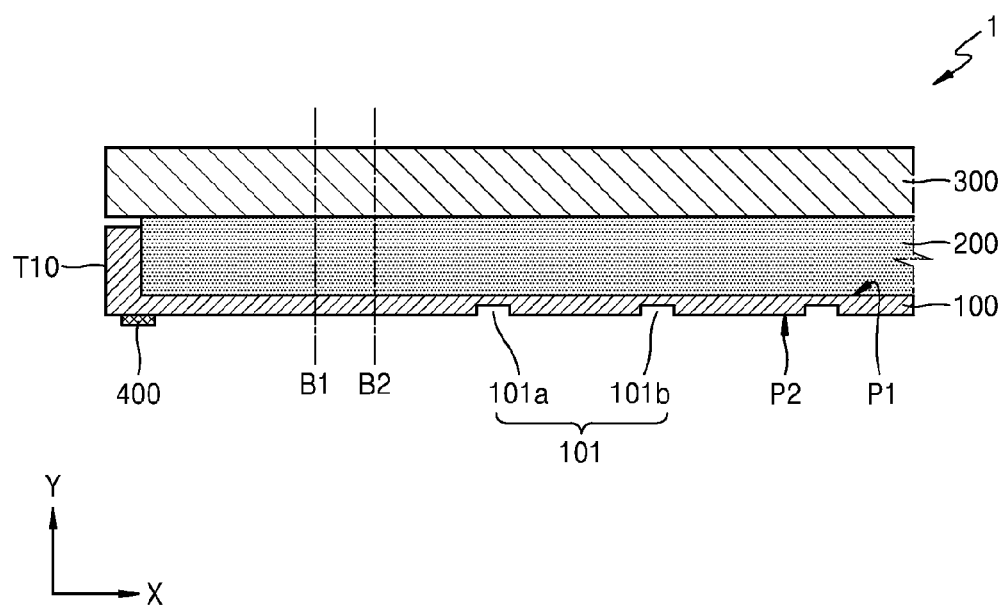
FIG. 1 is a cross-sectional view of a flexible display apparatus according to an embodiment.

Exemplary embodiments may have different forms and embodiments and should not be construed as being limited to the descriptions set forth herein. Accordingly, exemplary embodiments are merely described below, by referring to the figures, to explain aspects of the present disclosure.

Sizes of elements in the drawings may be exaggerated for convenience of explanation.

Reference will now be made in detail to embodiments, examples of which are illustrated in the accompanying drawings, wherein like reference numerals may refer to like elements throughout.

Figure 2:
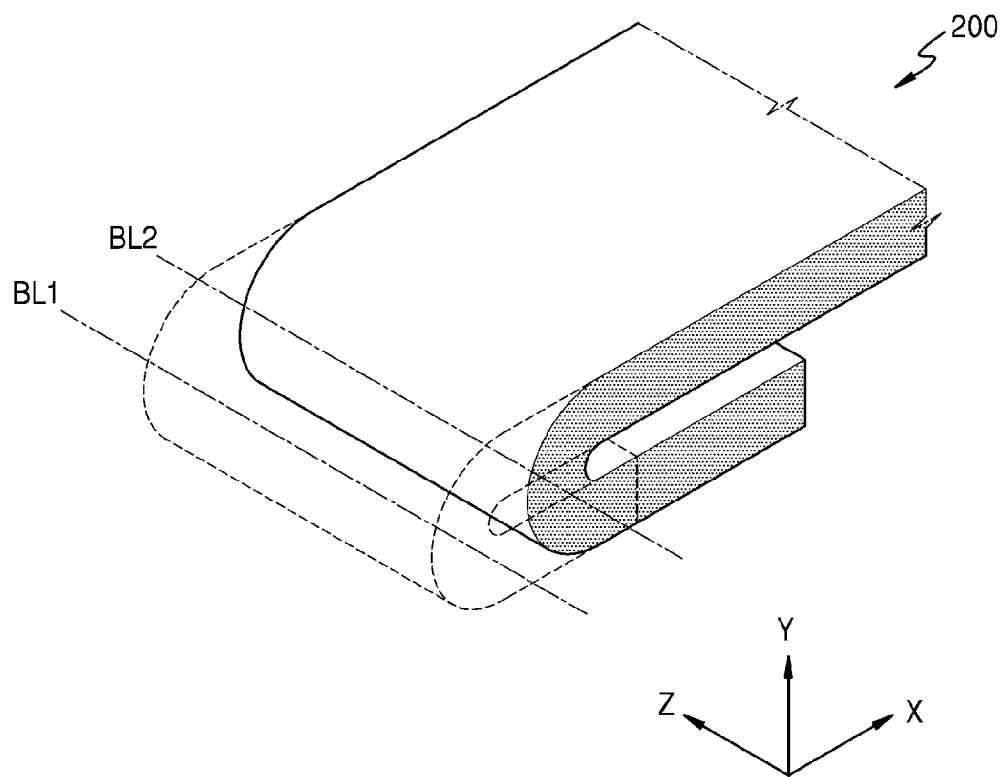
FIG. 2 is a perspective view of a bent or folded state of the flexible display apparatus of FIG. 1.
Figure 3:
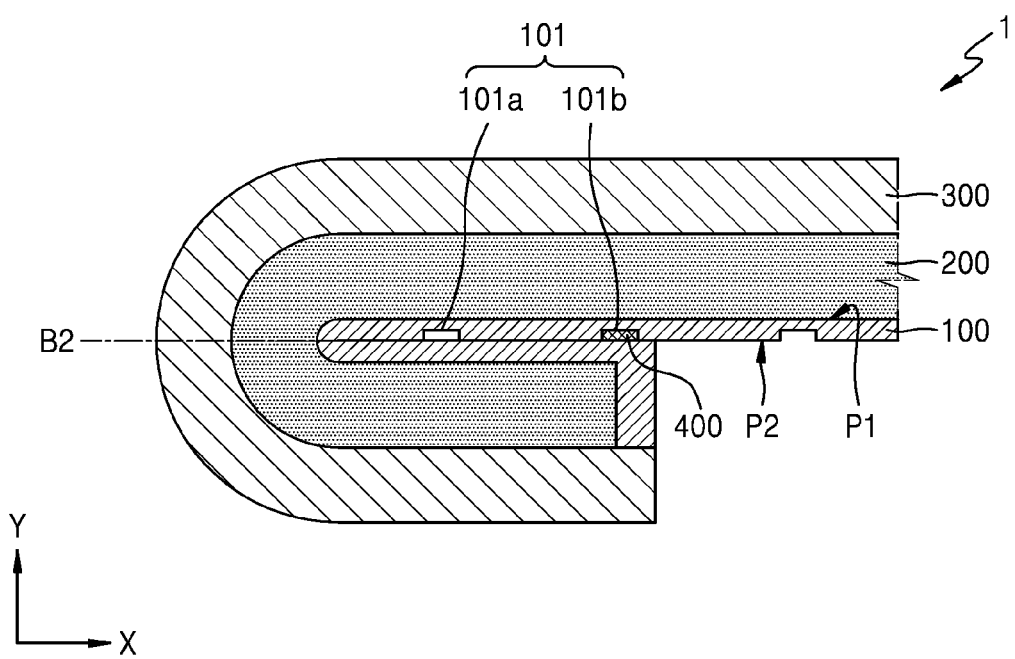
FIG. 3 is a cross-sectional view of a bent or folded state of the flexible display apparatus of FIG. 1.

FIG. 1 is a cross-sectional view of a flexible display apparatus 1 according to an embodiment, and FIGS. 2 and 3 are a perspective view and a cross-sectional view respectively of a bent or folded state of the flexible display apparatus 1 of FIG. 1.

Referring to FIG. 1, the flexible display apparatus 1 includes a support unit 100, a display panel 200, a window unit 300, and a fixing unit 400.

As illustrated in FIG. 2, the display panel 200 has the flexibility to be bendable or foldable at various positions thereof. The display panel 200 includes a display element disposed over a flexible substrate having a flexible material. Details of the display panel 200 will be described below with reference to FIG. 7.

Referring back to FIG. 1, the support unit 100 is disposed on a surface of the display panel 200. The support unit 100 includes a first surface P1 positioned adjacent to the display panel 200 and a second surface P2 positioned opposite to the first surface P1.

According to embodiments, a plurality of uneven portions 101 are disposed on the second surface P2 of the support unit 100. The plurality of uneven portions 101 are spaced apart from each other along a first direction, such as an X axis direction. According to an embodiment, the X axis direction is a lengthwise direction of the display panel 200 and is perpendicular to a Z axis direction, which is a bending axis illustrated in FIG. 2.

In an embodiment, the plurality of uneven portions 101 have a concave shape which is recessed inward from the second surface P2 toward the first surface P1. Each of the plurality of uneven portions 101 has a same shape. Each of the plurality of uneven portions 101 is a groove that extends along a width direction of the display panel 200 substantially perpendicular to the X axis direction, that is, the Z axis direction.

According to embodiments, the support unit 100 includes a first bent portion T10 that extends in a second direction toward window unit 300, that is, is bent in a Y axis direction. The first bent portion T10 is disposed outside the display panel 200 and surrounds the display panel 200. The support unit 100 safely protects the display panel 200 from external shock. That is, the support unit 100 can function as a housing in which the display panel 200 is disposed inside the support unit 100. The first bent portion T10 may be disposed at an edge of the support unit 100 or may overlap at least a portion of the fixing unit 400, which will be described below.

According to embodiments, the window unit 300 is disposed opposite to the support unit 100 with respect to the display panel 200 so that the display unit 200 is disposed inside the window unit 300. The window unit 300 is disposed over a side of the display panel 200 which displays an image to a user. The window unit 300 covers the display panel 200 and protects the display panel 200 from external shocks or scratches. The window unit 300 comprises a transparent material that allows a viewer to view an image displayed by the display panel.

According to embodiments, the fixing unit 400 is disposed on the second surface P2 of the support unit 100. At least a portion of the fixing unit 400 overlaps the first bent portion T10 of the support unit 100. The fixing unit 400 has a convex shape which protrudes outward from the second surface P2 of the support unit 100. The shape of the fixing unit 400 corresponds to or is complementary to a shape of the plurality of uneven portions 101.

Referring to FIGS. 2 and 3, the display panel 200 is bendable or foldable about a bending axis.

According to embodiments, when the display panel 200 is bent or folded about the bending axis, the support unit 100 and the window unit 300 are also correspondingly bent or folded. When the support unit 100 is bent or folded, the fixing unit 400 disposed over the support unit 100 is inserted into one of the plurality of uneven portions 101 of the support unit 100 so that the bent or folded state of the flexible display apparatus 1 can be stably maintained.

In addition, as illustrated in FIG. 2, there can be a plurality of parallel bending axes of the display panel 200. According to embodiments, the bending axes include a first bending axis BL1 and a second bending axis BL2. According to an embodiment, the first bending axis BL1 is closer to an edge of the display panel 200 than the second bending axis BL2.

Moreover, according to embodiments, as illustrated in FIG. 3, the support unit 100 includes the plurality of uneven portions 101. The plurality of uneven portions 101 include a first uneven portion 101a and a second uneven portion 101b. According to an embodiment, the first uneven portion 101a is closer to an edge of the support unit 100 than the second uneven portion 101b. Although two uneven portions 101a, 101b are described with reference to FIG. 1, embodiments are not limited thereto, and the flexible display apparatus 1 may have additional uneven portions, and additional corresponding bending axes, in other embodiments.

According to embodiments, as illustrated in FIG. 1, the display panel 200 can be bent or folded at a first portion B1 of the display panel 200 about the first bending axis BL1 or at a second portion B2 of the display panel 200 about the second bending axis BL2. A distance between the first bending axis BL1 and the fixing unit 400 is the same as a distance between the first bending axis BL1 and the first uneven portion 101a. A distance between the second bending axis BL2 and the fixing unit 400 is the same as a distance between the second bending axis BL2 and the second uneven portion 101b. In other words, each bending axis is halfway between the fixing unit 400 and the corresponding uneven portion 101.

According to embodiments, as described with reference to FIG. 2, when the display panel 200 is bent or folded about the second bending axis BL2, the fixing unit 400 is inserted into the second uneven portion 101b. Similarly, when the display panel 200 is bent or folded about the first bending axis BL1, the fixing unit 400 is inserted into the first uneven portion 101a. As such, the fixing unit 400 is inserted into one of the plurality of uneven portions 101 so that the flexible display apparatus 1 can be bent or folded at a position thereof according to a user preference.

According to embodiments, since the first uneven portion 101a and the second uneven portion 101b are spaced apart along the X axis direction, the bent state of the display panel 200 when the fixing unit 400 is inserted into the first uneven portion 101a is substantially the same as a bent state of the display panel 200 when the fixing unit 400 is inserted into the second uneven portion 101b. In this case, the first bending axis BL1 when the fixing unit 400 is inserted into the first uneven portion 101a is parallel to the second bending axis BL2 when the fixing unit 400 is inserted into the second uneven portion 101b.

In the flexible display apparatus 1 according to an embodiment, the display panel 200 is bent or folded so that at least a portion of the display panel 200 becomes convex toward the window unit 300. According to an embodiment, when the image of the display panel 200 is viewed through the window unit 300, the flexible display apparatus 1 according to an embodiment functions as an out-folding type flexible display apparatus.

Flexible display apparatuses according to embodiments will be described with reference to FIGS. 4 through 6. Here, differences between previously described embodiments and the embodiments of FIGS. 4 through 6 will be described, and repeated descriptions thereof will be omitted.

Figure 4:
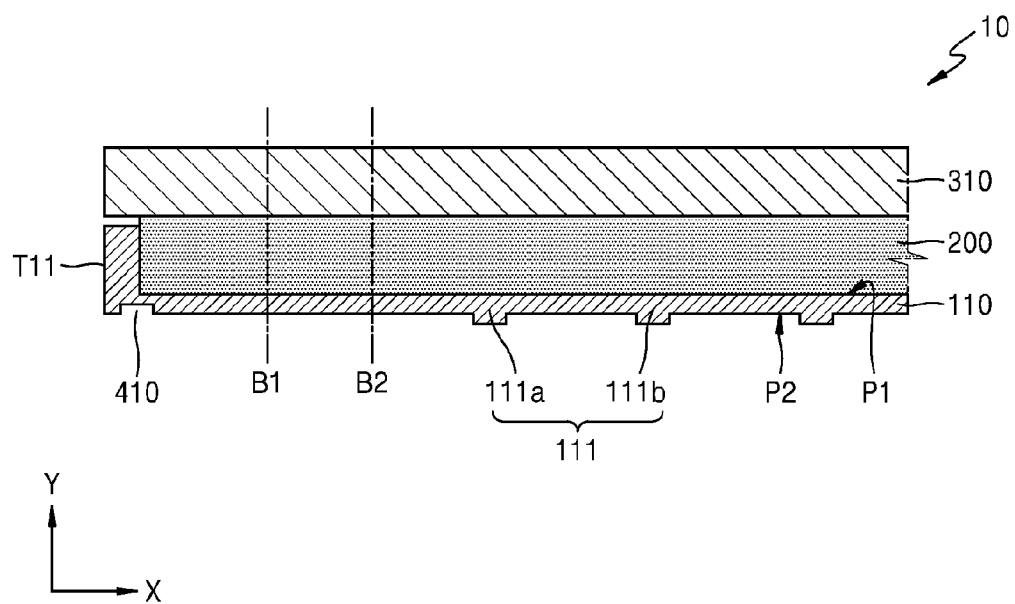
FIG. 4 is a cross-sectional view of a flexible display apparatus according to an embodiment.
Figure 5:
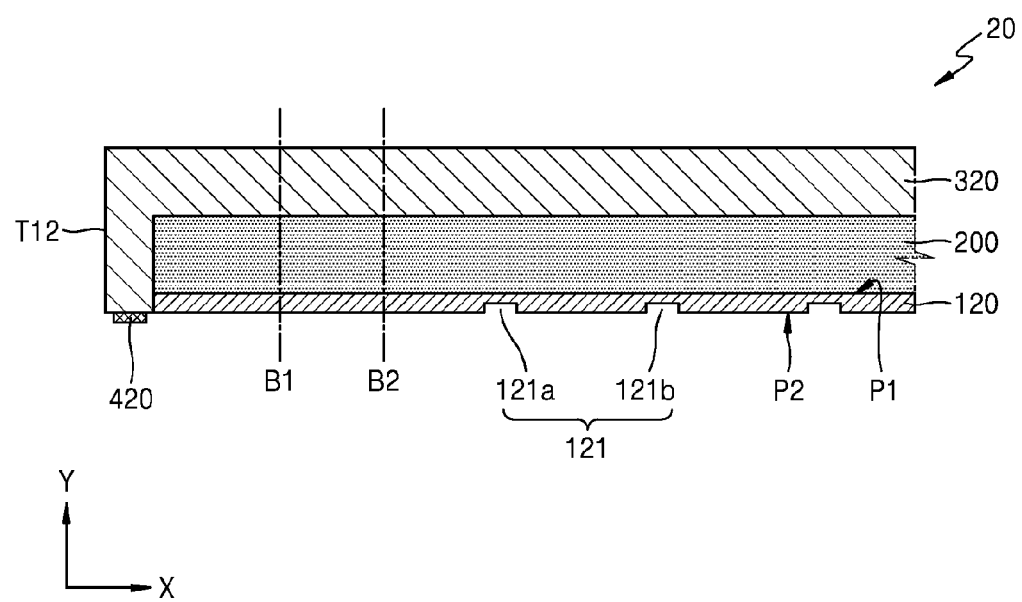
FIG. 5 is a cross-sectional view of a flexible display apparatus according to an embodiment.
Figure 6:
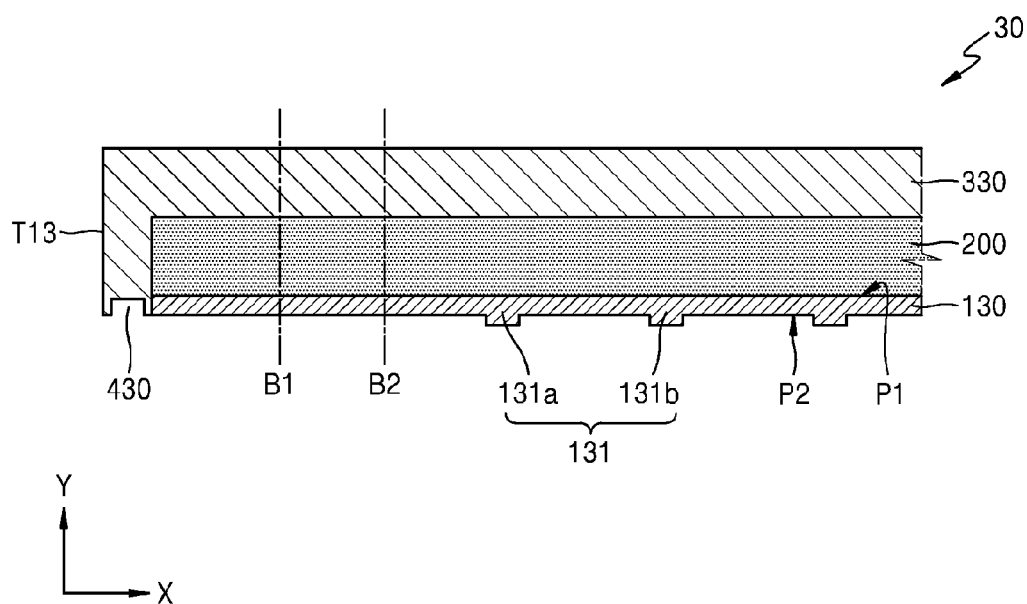
FIG. 6 is a cross-sectional view of a flexible display apparatus according to an embodiment.

FIG. 4 is a cross-sectional view of a flexible display apparatus 10 according to an embodiment, and FIGS. 5 and 6 are cross-sectional views of flexible display apparatuses 20 and 30, respectively, according to embodiments.

Referring to FIG. 4, according to embodiments, the flexible display apparatus 10 includes a support unit 110, a display panel 200, a window unit 310, and a fixing unit 410.

According to embodiments, the support unit 110 is disposed over a surface of the display panel 200. The support unit 110 includes a first surface P1 positioned adjacent to the display panel 200 and a second surface P2 positioned opposite to the first surface P1.

According to embodiments, a plurality of uneven portions 111 are disposed on the second surface P2 of the support unit 110. The plurality of uneven portions 111 are spaced apart from each other along a first direction, such as an X axis direction.

According to an embodiment, each of the plurality of uneven portions 111 has a convex shape which protrudes outward from the second surface P2. Each of the plurality of uneven portions 111 has a same shape. Each of the plurality of uneven portions 111 is a ridge that extends along a width direction of the display panel 200 substantially perpendicular to the X axis direction, that is, the Z axis direction. The plurality of uneven portions 111 includes a first uneven portion 111a and a second uneven portion 111b. According to an embodiment, the first uneven portion 111a is closer to an edge of the support unit 110 than the second uneven portion 111b. Although two uneven portions 111a, 111b are described with reference to FIG. 4, embodiments are not limited thereto, and the flexible display apparatus 10 may have additional uneven portions, and additional corresponding bending axes, in other embodiments.

According to embodiments, the support unit 110 includes a first bent portion T11 that extends in a second direction toward the window unit 310, that is, is bent in a Y axis direction. The first bent portion T11 is disposed outside the display panel 200 and surrounds the display panel 200.

According to embodiments, the window unit 310 is disposed opposite to the support unit 110 with respect to the display panel 200 so that the display panel 200 is inside the window unit 310. The window unit 310 is disposed over a side of the display panel 200, which displays an image to a user.

According to embodiments, the fixing unit 410 is disposed on the second surface P2 of the support unit 110. At least a portion of the fixing unit 410 overlaps the first bent portion T11 of the support unit 110.

According to an embodiment, the fixing unit 410 has a concave shape which is recessed inward from the second surface P2 of the support unit 110. The shape of the fixing unit 410 corresponds to or is complementary to the shape of the plurality of uneven portions 111.

Referring to FIGS. 2 and 3, according to embodiments, the display panel 200 is bendable or foldable about a bending axis.

As illustrated in FIG. 2, according to embodiments, the display panel 200 can be bent or folded about a first bending axis BL1 or a second bending axis BL2. As described above, the display panel 200 can be bent or folded at a first portion B1 of the display panel 200 about the first bending axis BL1 or at a second portion B2 of the display panel 200 about the second bending axis BL2. A distance between the first bending axis BL1 and the fixing unit 410 is the same as a distance between the first bending axis BL1 and a first uneven portion 111a. A distance between the second bending axis BL2 and the fixing unit 410 is the same as a distance between the second bending axis BL2 and a second uneven portion 111b. In other words, each bending axis is halfway between the fixing unit 410 and the corresponding uneven portion 111.

According to embodiments, when the display panel 200 is bent or folded about the first bending axis BL1, the fixing unit 410 receives the first uneven portion 111a. Similarly, when the display panel 200 is bent or folded about the second bending axis BL2, the fixing unit 410 receives the second uneven portion 111b. Accordingly, since the fixing unit 410 receives one of the plurality of uneven portions 111, the flexible display apparatus 10 can be bent or folded at a position thereof according to a user preference.

Referring to FIG. 5, according to embodiments, the flexible display apparatus 20 includes a support unit 120, a display panel 200, a window unit 320, and a fixing unit 420.

According to embodiments, the support unit 120 is disposed on a surface of the display panel 200. The support unit 120 includes a first surface P1 positioned adjacent to the display panel 200 and a second surface P2 positioned opposite to the first surface P1.

According to embodiments, a plurality of uneven portions 121 are disposed on the second surface P2 of the support unit 120. The plurality of uneven portions 121 are spaced apart from each other along a first direction, such as an X axis direction.

According to embodiments, each of the plurality of uneven portions 121 has a convex shape which is recessed inward from the second surface P2 toward the first surface P1. Each of the plurality of uneven portions 121 has a same shape. Each of the plurality of uneven portions 121 is a groove that extends a width direction of the display panel 200 substantially perpendicular to the X axis direction, that is, the Z axis direction. The plurality of uneven portions 121 includes a first uneven portion 121*a* and a second uneven portion 121*b*. According to an embodiment, the first uneven portion 121*a* is closer to an edge of the support unit 120 than the second uneven portion 121*b*. Although two uneven portions 121*a*, 121*b* are described with reference to FIG. 5, embodiments are not limited thereto, and the flexible display apparatus 20 may have additional uneven portions, and additional corresponding bending axes, in other embodiments.

According to embodiments, the window unit 320 is disposed opposite to the support unit 120 such that the display panel 200 is disposed inside the window unit 300. The window unit 320 is disposed on a surface of the display panel 200 which displays an image viewed by a user through the window unit 320.

According to an embodiment, the window unit 320 includes a second bent portion T12 which extends toward the support unit 120, that is, is bent in a Y axis direction. The second bent portion T12 is disposed outside the display panel 200 and surrounds the display panel 200.

According to embodiments, the fixing unit 420 is disposed on a surface of the second bent portion T12 of the window unit 32 that is coplanar with a surface that extends from the second surface P2 of the support unit 120. At least a portion of the fixing unit 420 overlaps the surface of the second bent portion T12 of the window unit 320.

According to embodiments, the fixing unit 420 has a convex shape which protrudes outward from the surface of the second bent portion T12 and the second surface P2 of the support unit 120. The shape of the fixing unit 420 corresponds to or is complementary to the shape of the plurality of uneven portions 121 such that the fixing unit 420 can be inserted into each of the plurality of uneven portions 121.

As illustrated in FIG. 2, according to embodiments, the display panel 200 can be bent or folded about a first bending axis BL1 or a second bending axis BL2. As described above, the display panel 200 can be bent or folded at a first portion B1 of the display panel 200 about the first bending axis BL1 or at a second portion B2 of the display panel 200 about the second bending axis BL2. A distance between the first bending axis BL1 and the fixing unit 420 is the same as a distance between the first bending axis BL1 and a first uneven portion 121*a*. A distance between the second bending axis BL2 and the fixing unit 420 is the same as a distance between the second bending axis BL2 and a second uneven portion 121*b*. In other words, each bending axis is halfway between the fixing unit 420 and the corresponding uneven portion 121.

According to embodiments, when the display panel 200 is bent or folded about the first bending axis BL1, the fixing unit 420 is inserted into the first uneven portion 121*a*. Similarly, when the display panel 200 is bent or folded about the second bending axis BL2, the fixing unit 420 is inserted into the second uneven portion 121*b*. Accordingly, since the fixing unit 420 can be inserted into one of the plurality of uneven portions 121, the flexible display apparatus 20 can be bent or folded at a position thereof according to a user preference.

Referring to FIG. 6, according to embodiments, the flexible display apparatus 30 includes a support unit 130, a display panel 200, a window unit 330, and a fixing unit 430.

According to embodiments, the support unit 130 is disposed on a surface of the display panel 200. The support unit 130 includes a first surface P1 positioned adjacent to the display panel 200 and a second surface P2 positioned opposite to the first surface P1.

According to embodiments, a plurality of uneven portions 131 are disposed on the second surface P2 of the support unit 130. The plurality of uneven portions 131 are spaced apart from each other along a first direction, such as an X axis direction.

According to an embodiment, each of the plurality of uneven portions 131 has a convex shape which protrudes outward from the second surface P2. Each of the plurality of uneven portions 131 has a same shape. Each of the plurality of uneven portions 131 is a ridge that extends along a width direction of the display panel 200 substantially perpendicular to the X axis direction, that is, the Z axis direction. The plurality of uneven portions 131 includes a first uneven portion 131*a* and a second uneven portion 131*b*. According to an embodiment, the first uneven portion 131*a* is closer to an edge of the support unit 130 than the second uneven portion 131*b*. Although two uneven portions 131*a*, 131*b* are described with reference to FIG. 6, embodiments are not limited thereto, and the flexible display apparatus 30 may have additional uneven portions, and additional corresponding bending axes, in other embodiments.

According to embodiments, the window unit 330 is disposed opposite to the support unit 130 so that the display panel 200 is disposed inside the window unit 330. The window unit 330 is disposed on a surface of the display panel 200 which displays an image to a user.

According to an embodiment, the window unit 340 includes a second bent portion T13 which extends in a second direction toward the support unit 130, that is, is bent in a Y axis direction. The second bent portion T12 is disposed outside the display panel 200 and surrounds the display panel 200.

According to embodiments, the fixing unit 430 is disposed on a surface of the second bent portion T13 of the window unit 330 that is coplanar with a surface that extends from the second surface P2 of the support unit 130. At least a portion of the fixing unit 430 overlaps the surface of the second bent portion T12 of the window unit 330.

According to embodiments, the fixing unit 430 has a concave shape which is recessed inward from the surface that extends from the second surface P2 of the support unit 130. The shape of the fixing unit 430 corresponds to or is complementary to a shape of the plurality of uneven portions 131 such that the fixing unit 430 can receive each of the plurality of uneven portions 131.

As illustrated in FIG. 2, according to embodiments, the display panel 200 can be bent or folded about a first bending axis BL1 or a second bending axis BL2. As described above, the display panel 200 can be bent or folded at a first portion B1 of the display panel 200 about the first bending axis BL1 or at a second portion B2 of the display panel 200 about the second bending axis BL2. A distance between the first bending axis BL1 and the fixing unit 430 is the same as a distance between the first bending axis BL1 and a first uneven portion 131*a*. A distance between the second bending axis BL2 and the fixing unit 430 is the same as a distance between the second bending axis BL2 and a second uneven portion 131*b*. In other words, each bending axis is halfway between the fixing unit 430 and the corresponding uneven portion 131.

According to embodiments, when the display panel 200 is bent or folded about the first bending axis BL1, the fixing unit 430 receives the first uneven portion 131a. Similarly, when the display panel 200 is bent or folded about the second bending axis BL2, the fixing unit 430 receives the second uneven portion 131b. Accordingly, since the fixing unit 430 can receive one of the plurality of uneven portions 131, a user can fold or bend the flexible display apparatus 30 at a position thereof according to the user's preference.

According to embodiments, as described above, a flexible display apparatus according to an embodiment can be bent or folded at various positions thereof, and a bent or folding state of the flexible display apparatus can be stably maintained.

Figure 7:
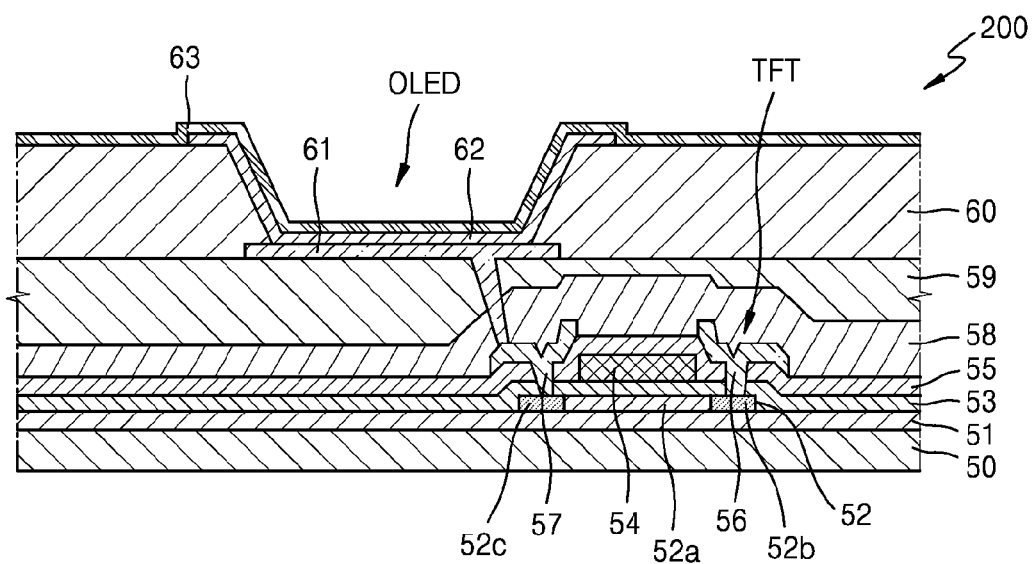
FIG. 7 is a cross-sectional view of a flexible display apparatus according to an embodiment.

FIG. 7 is a cross-sectional view of a flexible display apparatus according to an embodiment.

According to embodiments, as described above, the display panel 200 is a flexible display panel. The flexible display panel includes a display element over a flexible substrate. For convenience, a case in which the display element includes an organic light-emitting device will be hereinafter described as a structure of the flexible display panel. However, embodiments are not limited thereto, and the display element may be other than an organic light-emitting device in other embodiments.

Referring to FIG. 7, a flexible organic light-emitting display apparatus includes various elements over a substrate 50.

According to embodiments, the substrate 50 may be a flexible substrate or a portion cut-off from the flexible substrate. The substrate 50 includes a flexible substrate material, such as an organic material, such as polyimide, polyethylene naphthalate, polyethylene terephthalate, polyether ether ketone, polyether sulfone, poly(methyl methacrylate) (PMMA), polycarbonate, polypropylene, etc. When a flexible, thermally resistant polyimide is used in the flexible substrate, a transparent flexible substrate can be obtained.

According to embodiments, common layers, which include a buffer layer 51, a gate insulating film 53, and interlayer insulating film 55, are formed over the entire substrate 50. A patterned semiconductor layer 52 and elements of a thin film transistor TFT are formed over the substrate 50, wherein the patterned semiconductor layer 52 includes a channel area 52a, a source contact area 52b, and a drain contact area 52c, and the elements of the thin film transistor TFT, which are patterned together with the patterned semiconductor layer 52, include a gate electrode 54, a source electrode 56, and a drain electrode 57.

In addition, according to embodiments, a protection film 58 that covers the thin film transistor TFT, and a planarization film 59 that is disposed over the protecting film 58 and includes a flat upper surface, are disposed over the entire substrate 50.

According to embodiments, an organic light-emitting device OLED includes a pixel electrode 61 patterned on the planarization film 59, an opposite electrode 63 disposed over the entire substrate 50, and an intermediate layer 62 disposed between the pixel electrode 61 and the opposite electrode 63 that has a multilayered light-emitting layer is disposed over the planarization film 59.

According to embodiments, a portion of the intermediate layer 62 is a common layer that corresponds to the entire substrate 50, and the other portion of the intermediate layer 62 is a patterned layer that corresponds to the pixel electrode 61. The pixel electrode 61 is electrically connected to the thin film transistor TFT through a via hole. A pixel defining film 60 is formed over the entire planarization film 59 to correspond to the entire substrate 50.

It should be understood that exemplary embodiments described herein should be considered as descriptive only and not for purposes of limitation. Descriptions of features or aspects within each embodiment should typically be considered as available for other similar features or aspects in other embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A flexible display apparatus, comprising:
   a display panel that is bendable or foldable about at least one bending axis;
   a support unit that includes a first surface positioned adjacent to the display panel, a second surface positioned opposite to the first surface, and a plurality of uneven portions disposed on the second surface;
   a window unit disposed opposite to the support unit wherein the display panel is disposed between the window unit and the support unit; and
   a fixing unit disposed adjacent to an edge of the support unit and on the second surface of the support unit such that the fixing unit extends from the second surface, wherein a shape of the fixing unit is complementary to a shape of an uneven portion of the plurality of uneven portions.

2. The flexible display apparatus of claim 1, wherein the plurality of uneven portions are separated from each other and disposed along a direction substantially perpendicular to that of the at least one bending axis.

3. The flexible display apparatus of claim 1, wherein each of the plurality of uneven portions has a same shape.

4. The flexible display apparatus of claim 1, wherein, when the display panel is bent or folded, the support unit and the window unit are bent or folded to correspond to the display panel.

5. The flexible display apparatus of claim 1, wherein, when the display panel is bent or folded, the fixing unit is inserted into or receives one of the plurality of uneven portions.

6. The flexible display apparatus of claim 1, wherein a distance between the at least one bending axis and the fixing unit is the same as a distance between the bending axis and one of the plurality of uneven portions.

7. The flexible display apparatus of claim 1, further comprising a plurality of bending axes, wherein
   the respective bending axes are parallel to each other.

8. The flexible display apparatus of claim 1, wherein at least a portion of the display panel is convex toward the window unit, when bent or folded.

9. The flexible display apparatus of claim 1, wherein the display panel displays an image viewable through the window unit.

10. The flexible display apparatus of claim 1, wherein:
    the support unit includes a bent portion which extends toward the window unit; and
    at least a portion of the fixing unit overlaps the bent portion.

11. The flexible display apparatus of claim 1, wherein:
    the window unit includes a bent portion which extends toward the support unit; and
    at least a portion of the fixing unit overlaps the bent portion.

12. A flexible display apparatus, comprising:
    a bendable support unit;

a bendable window unit disposed opposite to the support unit, wherein the support unit includes a first surface positioned facing the window unit, a second surface positioned opposite to the first surface, and a plurality of uneven portions disposed on the second surface, wherein each of the plurality of uneven portions has a same shape; and a fixing unit disposed adjacent to an edge of the support unit and on the second surface of the support unit such that the fixing unit extends from the second surface, wherein a shape of the fixing unit is complementary to a shape of an uneven portion of the plurality of uneven portions, and wherein when the display apparatus is bent or folded, the fixing unit is inserted into or receives one of the plurality of uneven portions.

13. The flexible display apparatus of claim 12, further comprising a display panel disposed between the window unit and the support unit that is bendable or foldable about at least one bending axis.

14. The flexible display apparatus of claim 12, wherein the plurality of uneven portions are separated from each other and disposed along a direction substantially perpendicular to that of the at least one bending axis, and extend in a direction parallel to the at least one bending axis.

15. The flexible display apparatus of claim 12, further comprising a plurality of parallel bending axes, wherein each of the plurality of bending axes is halfway between the fixing unit and one of the plurality of uneven portions.

16. The flexible display apparatus of claim 12, wherein each of the plurality of uneven portions is a groove with a concave shape which is recessed inward from the second surface toward the first surface, and the fixing unit is a ridge with a convex shape that protrudes outward from second surface, wherein, when the display apparatus is bent or folded, the fixing unit inserts into one of the plurality of uneven portions.

17. The flexible display apparatus of claim 12, wherein each of the plurality of uneven portions is a ridge with a convex shape which protrudes outward from the second surface, and the fixing unit is a groove with a concave shape that is recessed inward from second surface toward the first surface, wherein, when the display apparatus is bent or folded, the fixing unit receives one of the plurality of uneven portions.

18. The flexible display apparatus of claim 12, wherein:
the support unit includes a bent portion which extends toward the window unit; and
at least a portion of the fixing unit overlaps the bent portion.

19. The flexible display apparatus of claim 12, wherein:
the window unit includes a bent portion which extends toward the support unit; and
at least a portion of the fixing unit overlaps the bent portion.

* * * * *